(12) United States Patent
Mahawili

(10) Patent No.: US 11,705,345 B2
(45) Date of Patent: Jul. 18, 2023

(54) SEMICONDUCTOR SYSTEM WITH STEAM GENERATOR AND REACTOR

(71) Applicant: Edwards Vacuum LLC, Sanborn, NY (US)

(72) Inventor: Imad Mahawili, Roseville, CA (US)

(73) Assignee: EDWARDS VACUUM LLC, Sanborn, NY (US)

( * ) Notice: Subject to any disclaimer, the term of this patent is extended or adjusted under 35 U.S.C. 154(b) by 153 days.

(21) Appl. No.: 16/862,898

(22) Filed: Apr. 30, 2020

(65) Prior Publication Data

US 2021/0343551 A1 Nov. 4, 2021

(51) Int. Cl.
*B01D 53/86* (2006.01)
*H01L 21/67* (2006.01)

(52) U.S. Cl.
CPC .. *H01L 21/67017* (2013.01); *H01L 21/67161* (2013.01); *H01L 21/67248* (2013.01)

(58) Field of Classification Search
CPC ... H01L 21/67017; B01D 53/70; B01D 53/72; B01D 53/8662; B01D 53/8668; B01D 53/885
See application file for complete search history.

(56) References Cited

U.S. PATENT DOCUMENTS

| | | |
|---|---|---|
| 1,926,958 A | 9/1933 | Peterson |
| 2,688,069 A | 8/1954 | Combest |
| 2,954,826 A | 10/1960 | Sievers |
| 4,835,363 A | 5/1989 | Hoffmann |
| 5,054,107 A | 10/1991 | Batchelder |
| 5,559,924 A | 9/1996 | Kadotani et al. |
| 6,321,035 B1 | 11/2001 | Gerosa |
| 2004/0141900 A1* | 7/2004 | Lei .................. F23G 7/061 423/240 R |
| 2007/0006483 A1* | 1/2007 | Kamikawa ...... H01L 21/67034 34/467 |
| 2007/0017502 A1 | 1/2007 | Kamikawa et al. |
| 2007/0274905 A1 | 11/2007 | Wynn |
| 2010/0058606 A1 | 3/2010 | Nakashima et al. |
| 2019/0249863 A1 | 8/2019 | Mahawili |
| 2019/0282948 A1* | 9/2019 | Mahawili ............... B01D 53/78 |

FOREIGN PATENT DOCUMENTS

| | | |
|---|---|---|
| DE | 102009010989 A1 | 9/2010 |
| WO | 2018080885 A1 | 5/2018 |

* cited by examiner

*Primary Examiner* — Jae Lee
(74) *Attorney, Agent, or Firm* — Gardner, Linn, Burkhart & Ondersma

(57) ABSTRACT

A semiconductor processing system includes a semiconductor processing chamber, a pump, an exhaust line in fluid communication with the chamber through the pump, and a steam generator and reactor. The steam generator and reactor has a process conduit with an inlet in line in the exhaust line for generating superheated steam and effecting transformations of chemicals in the exhaust fluid flowing in exhaust line into the inlet.

15 Claims, 10 Drawing Sheets

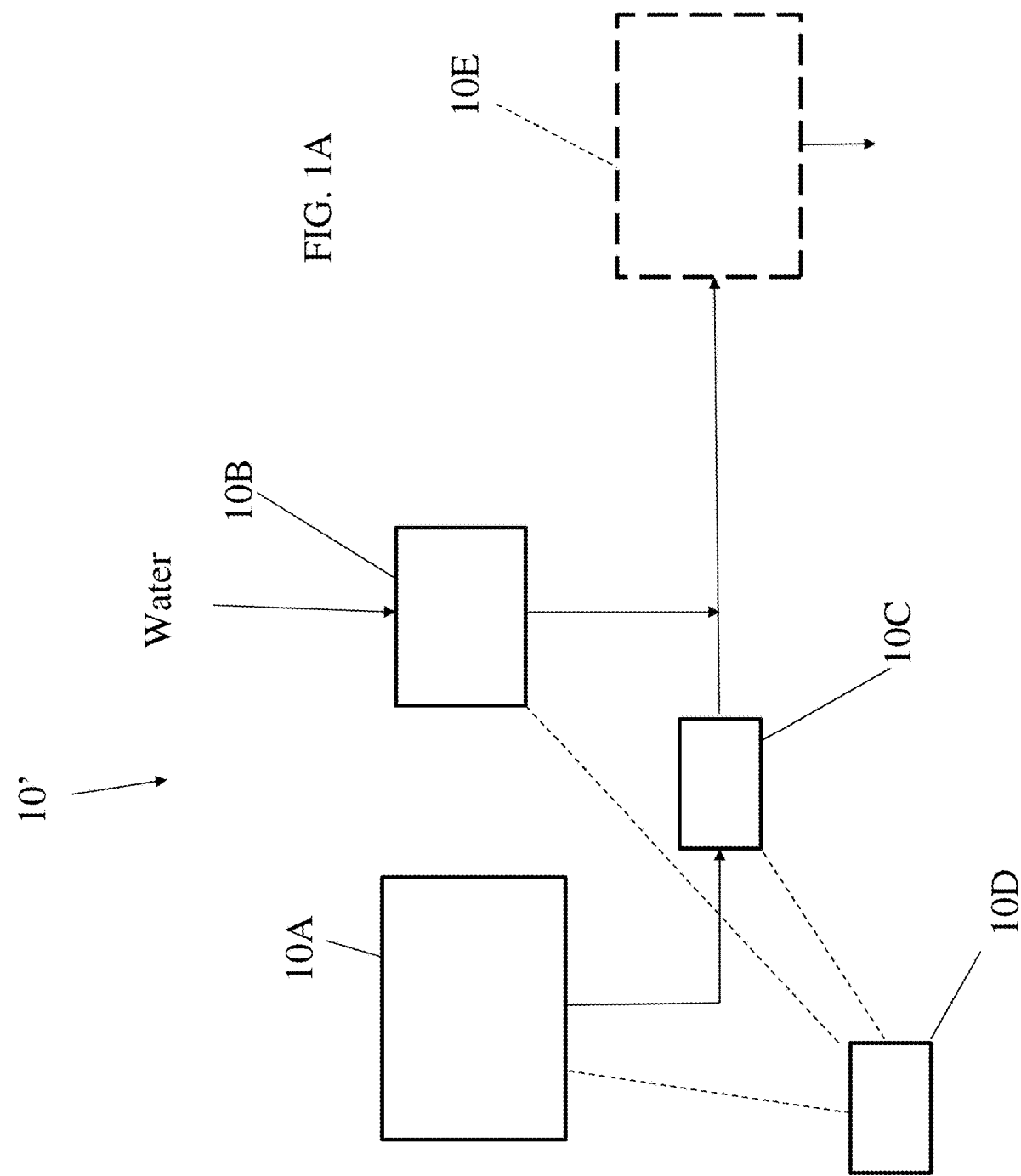

SEMICONDUCTOR SYSTEM WITH STEAM GENERATOR AND REACTOR

TECHNICAL FIELD AND BACKGROUND OF THE INVENTION

Steam generators are devices that use heat to boil liquid water and convert it into steam. The heat is typically from fossil fuels, electricity, nuclear energy, or renewal energy. There are number of different types of steam generators that operate under a wide range of operating pressures to achieve a wide range of steam quality production. Most steam generators are high pressure vessels constructed out of a variety of steels. Steam generators take a long time typically in the range of several minutes to hours to achieve steam at a predetermined stable operating pressure and temperature.

For example, small steam generators, which typically use electricity, take several minutes to produce saturated steam at approximately one atmosphere and nearly 100 degrees centigrade. Small superheated steam generators, which typically output steam at about 500 degrees centigrade or greater, take a much longer time to achieve the desired boiler pressure that produces the desired superheated steam temperatures. Accordingly, their application in some manufacturing processes that demand rapid superheated steam injection such as semiconductor processing, can be severely limited.

SUMMARY

In one embodiment, a semiconductor processing system includes a semiconductor processing chamber, a pump, an exhaust line in fluid communication with the chamber through the pump, and a steam generator and reactor. The steam generator and reactor has a process conduit with an inlet in line in the exhaust line for generating superheated steam and effecting transformations of chemicals in the exhaust fluid flowing in exhaust line into the inlet.

In one aspect, the steam generator and reactor is configured to generate superheated steam at least at 101 C, and optionally in a range from 101 C to about 1150 C. Optionally, the steam generator and reactor is configured to generate superheated steam in a range of about 600 C to about 1150 C, and in some embodiments in 5-15 seconds.

In one embodiment, the steam generator and reactor is in fluid communication with the exhaust line downstream of the pump.

In one embodiment, the inlet of the steam generator and reactor comprises a second inlet, and the steam generator and reactor has a first inlet in fluid communication with the process conduit and a supply of water. The steam generator is configured to generate steam from the water flowing into the process conduit from the first inlet. The second inlet is in fluid communication with the process conduit downstream of the first inlet wherein the exhaust fluid is injected into the steam formed with the water flowing in from the first inlet.

In a further embodiment, the steam generator and reactor is configured to generate superheated steam in the water flowing into the process conduit from the first inlet, and the second inlet is in fluid communication with the process conduit downstream of the first inlet wherein the exhaust fluid is injected into the superheated steam formed with the water flowing in from the first inlet fluid.

In one embodiment, the steam generator and reactor is configured to generate superheated steam in the exhaust line fluid from the exhaust line. For example, the steam generator and reactor generates the superheated steam in the exhaust line fluid at or near the pump outlet.

In one embodiment, the steam generator and reactor comprises a plurality of tungsten halogen lamps, such as high temperature tungsten halogen lamps, spaced around at least a portion of the process conduit.

In one embodiment, the at least a portion of process conduit comprises a first portion, with the process conduit having a second portion that surrounds the lamps.

According to another embodiment, a method of transforming a liquid and/or a gas in the exhaust fluid flowing in an exhaust line from a semiconductor chamber includes the steps of providing a steam generator and reactor, the steam generator and reactor having a process conduit with at least one inlet and an outlet and configured to generate superheated steam in the process conduit to a temperature of at least 101 C. Locating the steam generator and reactor wherein the at least one inlet is in fluid communication with the exhaust fluid line of the semiconductor chamber wherein at least a portion of the process conduit is in line with the exhaust line. And further flowing the exhaust fluid into the at least one inlet of the steam generator and reactor, and generating the superheated steam in the process conduit to thereby convert liquid and/or gas in the exhaust fluid into another compound or compounds.

In one embodiment, generating the superheated steam includes generating superheated steam to a temperature of at least 200 C in about 5-15 seconds.

In another embodiment, wherein the generating the superheated steam includes generating superheated steam to a temperature of about 1000 C-1150 C in about 5-15 seconds.

In one embodiment, the at least one inlet comprises first and second inlets. The method further includes flowing water into the first inlet and generating steam with the water, and the flowing the exhaust fluid into the second inlet and directing the exhaust fluid through the second inlet into the process conduit downstream of the first inlet.

In a further aspect, generating steam with the water includes generating superheated steam with the water upstream of the second inlet and wherein the flowing the exhaust fluid includes flowing the exhaust fluid into the superheated steam.

In one embodiment, a method of transforming a liquid and/or a gas in an exhaust line of a semiconductor chamber includes flowing the liquid and/or gas through a process conduit, locating one or more tungsten halogen lamps in close proximity to the process conduit, and using at least a portion of the heat emitted from the one or more tungsten halogen lamps to heat the liquid and/or gas flowing through the conduit so that the liquid and/or gas transform into chemical components or into a new compound.

DETAILED DESCRIPTION OF THE DRAWINGS

FIG. 1A is a schematic drawing of another arrangement of the semiconductor system of FIG. 1;

FIG. 2 is a schematic drawing of the steam generator and reactor of FIG. 1 (and FIG. 1A) illustrating one embodiment of the generator and reactor with a lamp array with a process conduit extending there through;

FIG. 4A is a cross-section view taken through line IVA-IVA of FIG. 4;

DETAILED DESCRIPTION OF THE PREFERRED EMBODIMENTS

Figure 1:
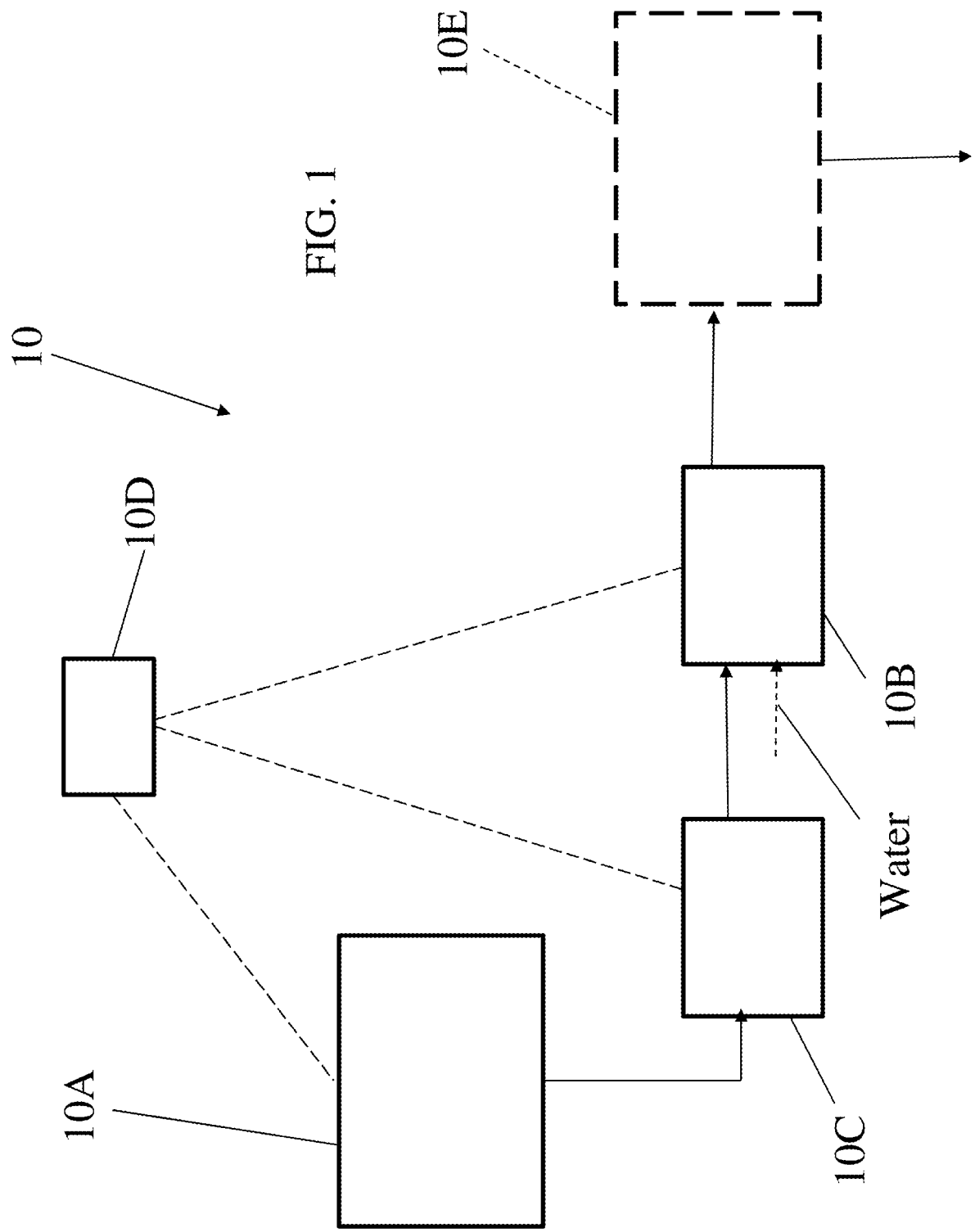
FIG. 1 is a schematic drawing of a semiconductor system with a semiconductor processing chamber, a steam generator and reactor, and control system.

Referring to FIG. 1, the numeral 10 generally designates a semiconductor processing manufacturing system with a semiconductor chamber 10A and a steam generator and reactor 10B, which, as described more fully below, is configured to generate steam at temperatures and rates that are sufficient to effect conversion (e.g. both physical and chemical transformation) of chemicals (in liquid(s) and/or gas(es)) output from semiconductor chamber 10A and which is suitable for use in line processing as part of a semiconductor manufacturing process. For example, steam generator and reactor 10B can generate superheated steam in seconds versus minutes, which is associated with conventional steam generators. As will be more fully described below, steam generator and reactor 10B is configured to produce nearly instantaneous steam and, more specifically, nearly instantaneous superheated steam at about one atmosphere and at a temperature of greater than 100 C and optionally in a range of 100 C to several hundred degrees centigrade, and further up to about 1150 C. Steam generator and reactor 10B may heat a fluid or fluids, such as liquid(s) and/or gas(es), to generate steam, specifically superheated steam, and further may be used to associate or disassociate the gas(es) and/or liquid(s) into other desired or acceptable compounds, and thereby convert them from an undesirable compound into one or more desirable or acceptable compounds. Several examples of the amount of steam, the temperature of the steam, and the rate of steam production are provided below.

Referring again to FIG. 1, the semiconductor chamber 10A is in fluid communication with steam generator and reactor 10B through a pump 10C, such as a vacuum pump. Pump 10C optionally comprises a two stage pump. The pressure in the portion of the exhaust line connecting the chamber 10A to the pump 10C is the processing pressure. For example, in a typical TEOS oxidation process, the line pressure is in a range of about 100 to 500 milli Torr (mTorr) and optionally about 300 milli Torr (mTorr). The pump uses a purge flowrate of approximately 50 standard liters per minute (slm) as it compresses the chamber exhaust line pressure to near one atmosphere. As will be described below, superheated steam is generated or introduced to convert the gas phase concentration of undesirable unreacted gas or gases into a desirable or at least acceptable compound or compounds.

Optionally, steam generator and reactor 10B may be located adjacent, including immediately adjacent, pump 10C, such that the superheated steam generation is at or near the pump outlet. Further, steam generator and reactor 10B may be assembled as part of the pump so that the pump and steam generator and reactor 10B may comprise an assembly.

Although not illustrated, semiconductor processing system 10 may include a nitrogen dilution supply (not shown), which delivers nitrogen to the exhaust line of the semiconductor chamber 10A (downstream of the pump) for cleaning and/or inerting purposes using a very low flowrate to purge the process lines. However, the nitrogen supply for dilution and inerting is not necessary and can be eliminated with the use of steam generator and reactor 10B.

Additionally, when superheated steam is used to displace costly nitrogen inerting in semiconductor processing, system 10 may also include a conventional waste gas scrubber 10E to condense the superheated steam and abate the waste processing gas using a natural gas buriner. The gas stream of the exhaust steam maybe injected immediately into the burn box of the scrubber. Though with the use of steam generator and reactor 10B, the scrubber may also be eliminated.

As noted above, system 10 includes steam generator and reactor 10B that generates superheated steam to effect conversion (e.g. both physical and chemical transformations) of the chemicals used and discharged into the exhaust line from semiconductor chamber 10A. The operation of steam generator and reactor 10B is controlled by a control system 10D, which also may control the operation of semiconductor chamber 10A, pump 10C, and other components in system 10. It should be understood that control system 10D may comprise a single controller or a network of controllers, such as peer-to-peer network or a CAN network, which facilitates upgrades or changes to the components.

Figure 2:
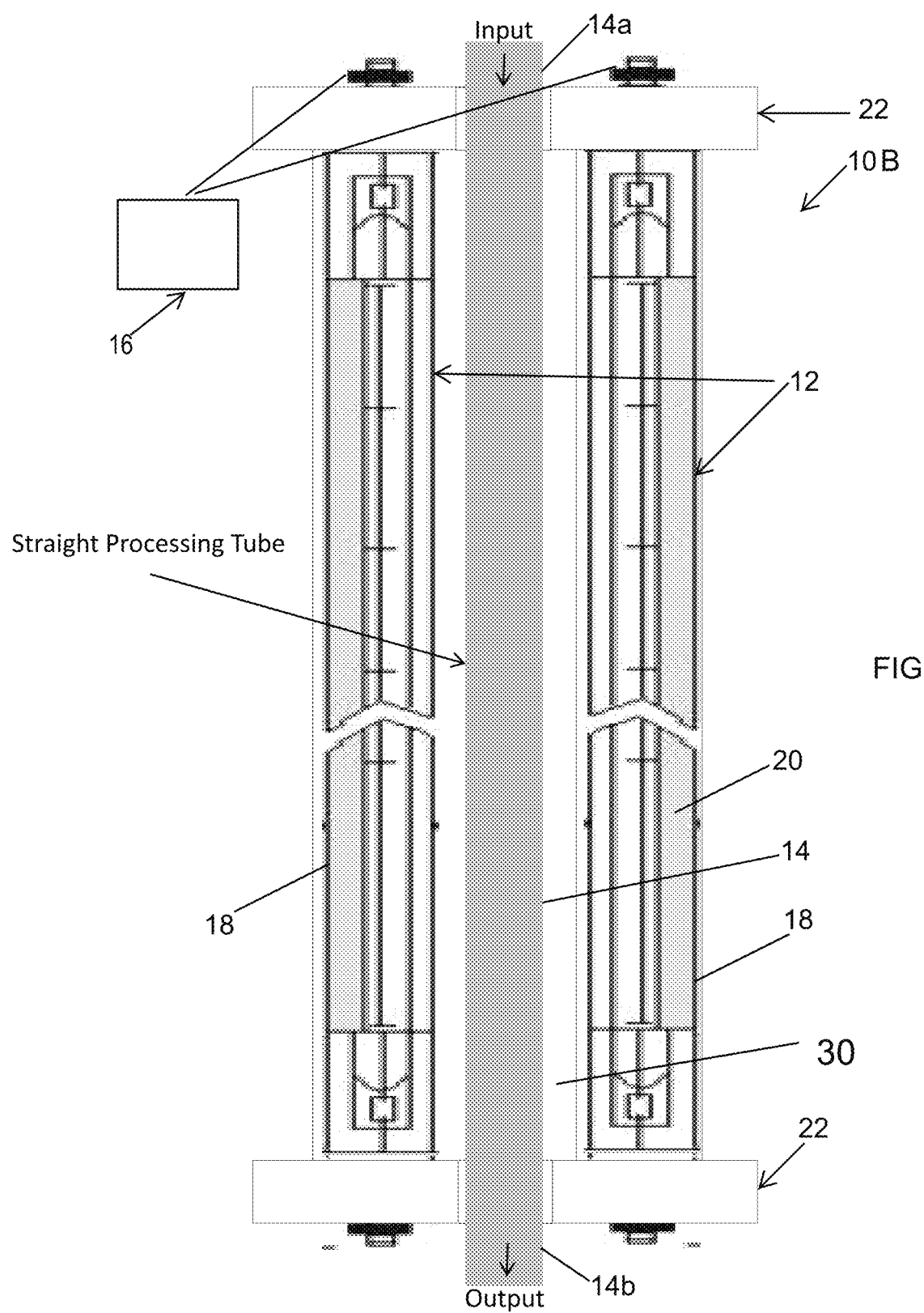

Referring to FIG. 2, steam generator and reactor 10B includes one or more incandescent lamps 12 and a process conduit 14. As best seen on FIG. 2, in the illustrated embodiment, process conduit 14 is coaxial with and centrally located between the lamps 12. Process conduit 14 includes at least one inlet 14a for receiving the fluid exhaust from semiconductor chamber 10A and at least one outlet for discharging the processed exhaust fluid.

Lamps 12 are mounted and located in close proximity to process conduit 14, for example, in a spacing in a range of a few millimeters to a few centimeters (as noted below) from the process conduit. As understood from the above description and the drawings, inlet 14a of process conduit 14 may be in fluid communication and in line with the exhaust line of semiconductor processing chamber 10A, downstream of pump 10C, so that the exhaust of semiconductor chamber is directed through at least a portion of the steam generator and reactor 10B. In this manner, the liquid(s) and/or gas(es) exhausted from semiconductor processing chamber 10A can be heated by the superheated steam generated by the steam generator and reactor 10B, as noted, which can be used to effect conversion (e.g both physical and chemical transformations) of chemicals used in and exhausted (output) from semiconductor chamber 10A into one or more desirable or at least acceptable compounds. Several examples of such conversions are described below, though it should be understood that many more chemicals may be converted using the process described herein, and therefore the process parameters will change depending on the chemicals as well as the environment, such as pressure, temperature, and presence of other chemicals, e.g. oxygen.

For example, when lamps 12 are operated (such as described below) to generate 101 C superheated steam or above, including around 200 C, the superheated steam can volatize some organic compounds and effectively prevent them from condensation and in some cases further polymerization without molecular destruction. Superheated steam can react directly with some organic and inorganic compounds to produce all sorts of products. The higher the temperature of the generated superheated steam the more effective the steam is in the chemical conversion, synthesis and destruction of such compounds.

For example, when lamps 12 are operated (such as described below) to generate superheated steam at 700 C, the 700 C superheated steam can convert methane gas to hydrogen and carbon monoxide at one atmosphere. Naphtha, a high molecular weight organic compound, can be cracked to lower molecular weight products, such as ethylene and propylene, using steam at about 600 C.

Tetraethyl Orthosilicate (TEOS) is heavily used in semiconductor processing. Typically about 25% of the TEOS is used to deposit silicon dioxide on a semiconductor wafer and the remaining 75% flows with waste or exhaust gas stream output, for example, from semiconductor chamber 10A, and must be disposed of. To convert this excess TEOS to various byproducts, the output from chamber 10A containing the excess TEOS is directed to steam generator and reactor 10B, via process conduit 14, where the TEOS, as a result of the temperature applied by steam generator and reactor 10B, will convert to a variety of byproducts that include silicon dioxide, ethyl alcohol, carbon monoxide, ethene, carbon dioxide and even carbon depending on the temperature of the superheated steam and the presence of oxygen or ozone (which s very typical in the TEOS semiconductor processes). TEOS can go from gentle molecular conversion or aggressive oxidation or even pyrolysis depending the superheated steam temperature. As will be described below, with the use of the high temperature lamps, steam generator and reactor 10B can produce superheated steam to a controlled steam temperature up to 1150 C and therefore can destroy such TEOS waste gas stream effluent.

In another example, when Titanium Tetrachloride (TiCl4) is used chemical in semiconductor processing in chamber 10A, when mixed with ammonia, TiCl4 produces titanium nitride. About 75% of the TiCl4 gas feed may be found in the semiconductor processing waste gas from semiconductor chamber 10A. The steam generator and reactor 10B can be used to convert this excess TiCl4 at temperature in the range of 200 C to 700 C depending on what other gases present in the waste stream. Superheated steam generated by steam generator and reactor 10B converts TiCl4 to titanium dioxide solid and hydrogen chloride gas. The hydrogen chloride gas can be water scrubbed (as noted above) and the titanium dioxide solids are discharged in the waste water effluent stream.

In yet another example, when Trimethyl Aluminum (TMA) is used in semiconductor chamber 10A, to produce high dielectric thin films, TMA in the waste gas stream of semiconductor chamber 10A can be effectively and safely converted to aluminum oxide and methane gas when the superheated steam generator and reactor 10B is used. The oxide solids can subsequently be removed post a water scrubber.

Figure 3:
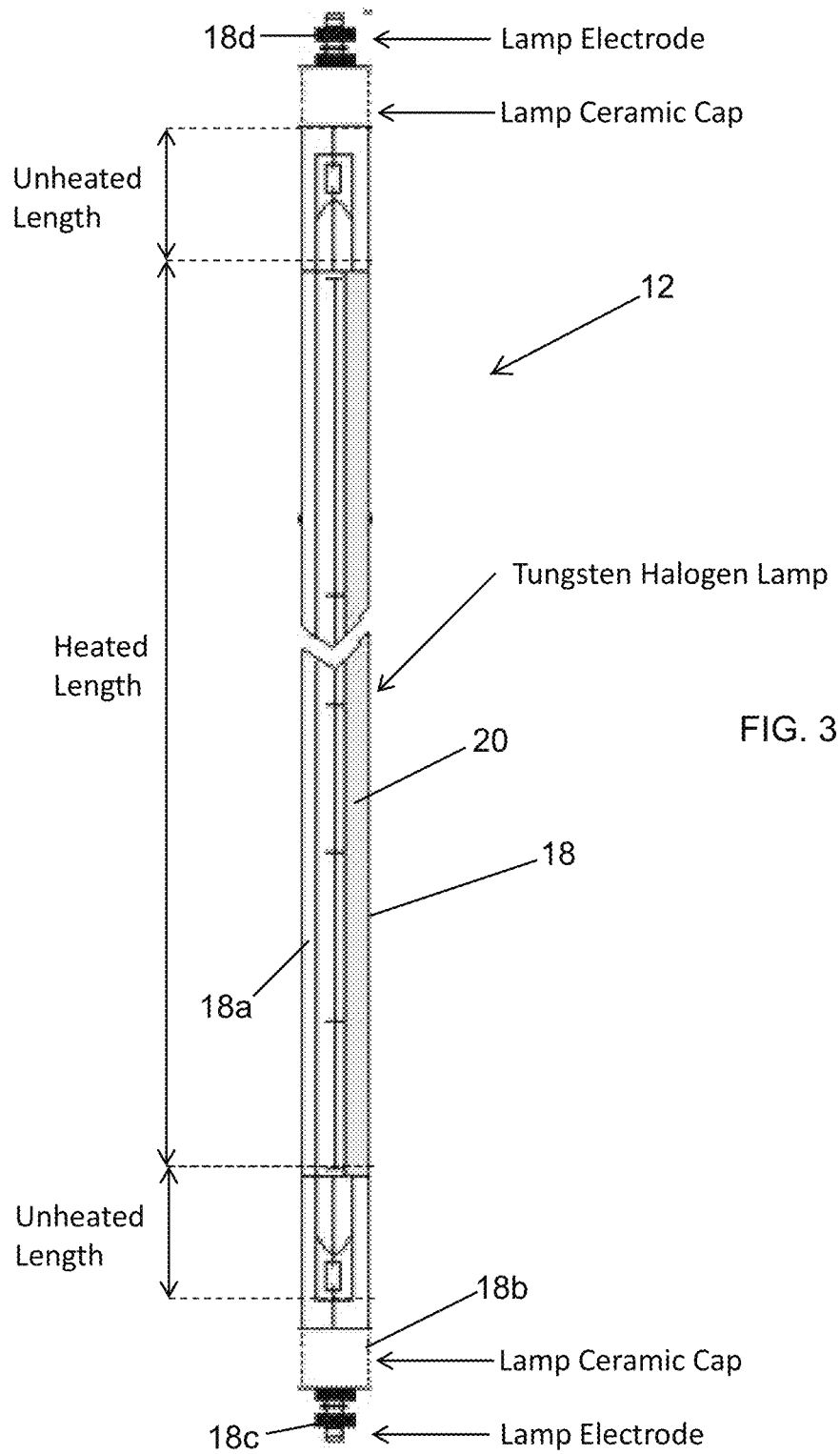
FIG. 3 is an enlarged view of typical commercial tungsten halogen high temperature lamp.
Figure 4:
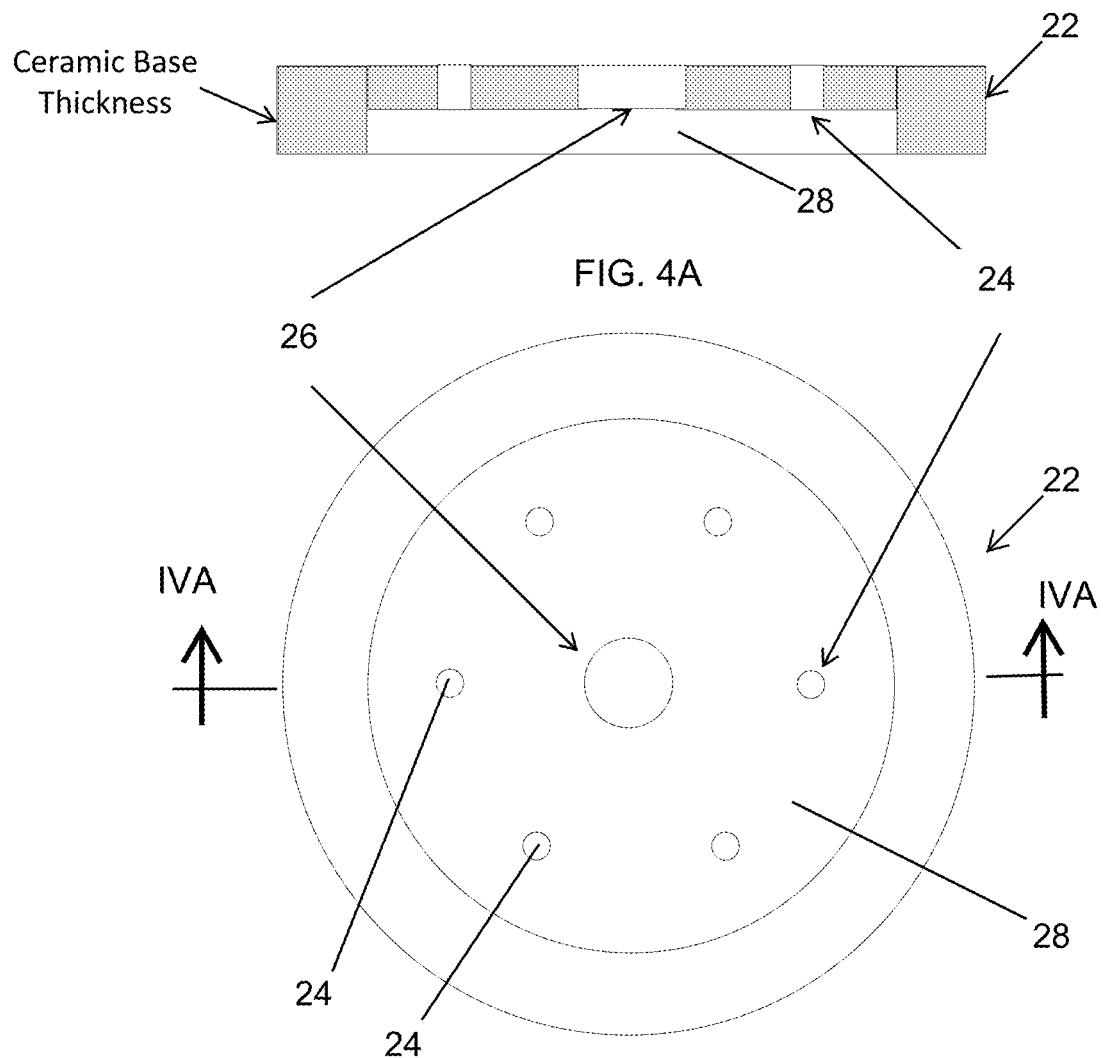
FIG. 4 is an enlarged plan view of an end base for a plurality of lamps.

Referring to FIGS. 2, 3 and 4, as noted above, steam generator and reactor 10B includes a plurality of incandescent lamps 12, which are arranged around the process conduit 14 (though as will be described below, the process conduit, or at least a portion of it, may be arranged around the lamps). In the illustrated embodiment, incandescent lamps 12 comprise a plurality of tungsten halogen lamps 18 (e.g. see FIGS. 2, 3, and 4), including for example tungsten halogen high temperature lamps, for example, including 500 W-1000 W lamps. Tungsten halogen high temperature lights are incandescent tungsten lamps that have tungsten filament and a small amount of halogen gas, such as iodine or bromine added. The addition of the halogen gases to the tungsten filament produces a halogen cycle chemical reaction that increases the operating life of the lamp. Tungsten halogen high temperature lamps are commercially available from a variety of companies, for example Fannon in the US or Ushio of Japan. As described in the Fannon technical specifications, their output typically ranges from about 2400 K to about 3400 K color temperature.

Optionally, referring to FIG. 3, lamps 18 may be manufactured with a totally clear quartz cylindrical bulb or housing 18a or may have portion of the inside of the housing coated with a film 20, such as partial gold thin-film, to form a window between the terminal edges of the film to focus the energy emitted from the filament inside the housing in a desired direction formed by the window. Alternately or in addition, an external reflective coating, such as a thin gold film, may be applied to the exterior of the housing, which also similarly forms a window between the terminal edges of the film. Lamps 18, which as noted are conventional, may include a ceramic cap 18b on each end into which the ends of the filament extend and couple to electrodes 18c, 18d for coupling the respective lamp to a power supply as controlled by control system 16.

To support the lamps 18 in a spaced relationship around the process conduit 14, generator 10B includes first and second end bases 22, such as shown in FIG. 4. Each end base 22 may be formed from a ceramic material, including mica or a machineable ceramic material, such as a machineable glass ceramic, which is available under the trademark Macor. As best seen in FIGS. 4 and 4A, end bases 22 include a plurality of openings 24 through which the lamp electrodes extend for coupling the power supply. In the illustrated embodiment, end bases 22 are formed from a disk shaped member with an optional central opening 26 for receiving the process conduit and an annular recess 28 that extends around opening 26 for receiving the respective end caps of lamps 18. As would be understood the shape, size, number of openings and location of the openings in the end bases may vary depending on the size and number of lamps that are used, and the type of process conduit, as will be more fully described below. As shown, openings 24 may be spaced so that lamps 18 are uniformly spaced around and from process conduit 14, to apply uniform heating to the process conduit 14.

Figure 2A:
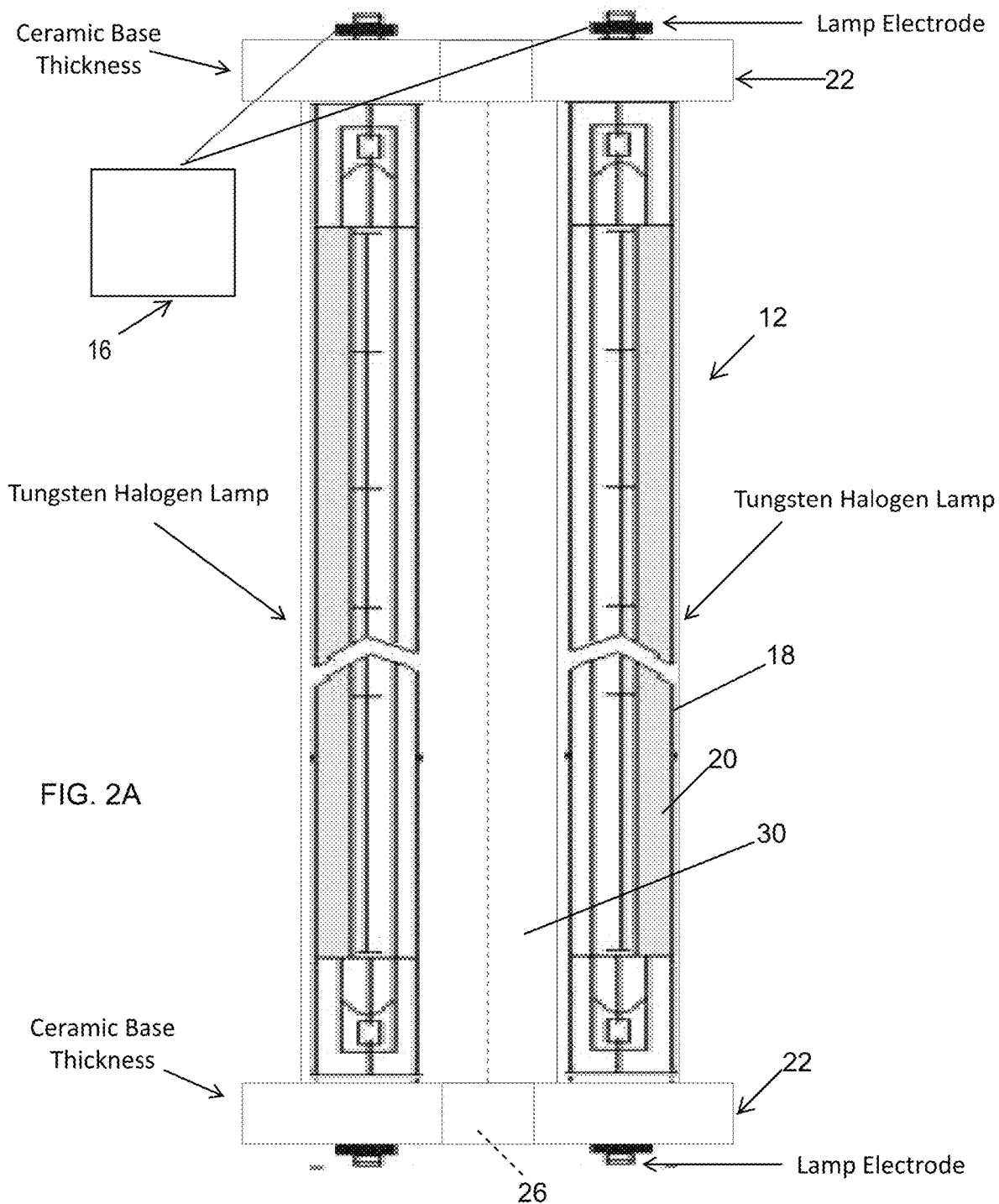
FIG. 2A is a similar drawing to FIG. 2 with the process conduit removed.

Openings 24 are located in an annular recess 28 of end base 22 and arranged around radially spaced from opening 26 so that when the lamps are mounted to the respective end bases 22, lamps 18 will be arranged around opening 26 to form a central passage 30 (FIGS. 2 and 2A) there between to receive process conduit 14. Thus, in this embodiment, the lamps 18 uniformly surround the process conduit 14. Hence, the reflective coating 20 may be applied to the outer side of the respective lamps so that the heat emitted by the lamps is directed inwardly toward the process conduit. The number of lamps may be varied, including at least two lamps, at least four lamp, and optionally six or more lamps, as shown in the illustrated embodiment.

To increase the heat transfer from lamps 18 to process conduit 14 and the liquid(s) and/or gas(es) flowing through process conduit 14, as noted above, lamps 18 are located in close proximity to process conduit 14 (FIG. 2). For example, the term close proximity means in a range of 5 to 10 mm, in a range of 2 to 30 mm, or optionally in a range of 1 to 7 mm. In this manner when combined with the use of the reflective coatings, most if not all, the heat emitted from the lamps may be directed toward the process conduit.

Referring to FIG. 1, computer based control system 10D is configured control the process parameters and flow of fluid or fluids into semiconductor chamber 10A, which may also be used to control the operation of lamps 18. Computer-based control system 10D includes one or more microprocessor based controllers 16 and may include one or more sensors in communication with the controller 16 to detect one or more process parameters associated with steam generator and reactor 10B. Computer-based control system 10D is coupled to a power supply (not shown) and to the electrodes of the lamps via controller 16 to regulate the power delivered to the light or lights, for example based on one or more process parameters, such as the type of fluid output from semiconductor processing chamber 10A to be processed by steam generator and reactor, the fluid flow rate, and/or the desired superheated steam temperature.

For example, computer-based control system 10D may include one or more sensors to detect the flow rate of the fluid at or near the input 14a and one or more temperature sensors to detect the steam's temperature at or near the outlet 14b, and optionally to detect the temperature of the conduit and/or the lamps. Computer-based control system 10D, including controller 16, may also include other electronic components that are programmed to carry out the functions described herein, or that support the microprocessor and/or other electronics. The other electronic components include, but are not limited to, one or more discrete circuitry, integrated circuits, application specific integrated circuits (ASICs) and/or other hardware, software, or firmware, as would be known to one of ordinary skill in the art. Such components can be physically configured in any suitable manner, such as by mounting them to one or more circuit boards, or arranging them in other manners, whether combined into a single unit at the generator in a control unit or distributed across multiple control units. Such components may be located at the generator or they may reside separately from the generator, for example, in remote location from the generator. When located separately, the components may communicate using any suitable serial or parallel communication protocol.

Referring again to FIG. 2, in the illustrated embodiment, process conduit 14 comprises a straight tube, such as a tube formed from a variety of materials, such as steel, stainless steel alloys, aluminum, copper, glass, quartz, alumina, silicon carbine, zirconia or the like, that extends through passage 30 (FIGS. 2 and 5) and through the enclosure described below. The diameter and wall thickness of the tube may vary, and depend on the specific process requirements and the desired chemical reaction result to be achieved, but should be no less than about 6.35 mm (0.25 inches) in diameter. For example, the diameter of the tube may typically fall in a range of 150 to 300 mm, in a range of 100 to 1500 mm, or optionally in a range of 300 to 600 mm with a wall thickness falling in a range of 0.12 to 0.75 mm, in a range of 0.02 to 2.54 mm, or optionally in a range of 0.25 to 0.5 mm.

Figure 5:
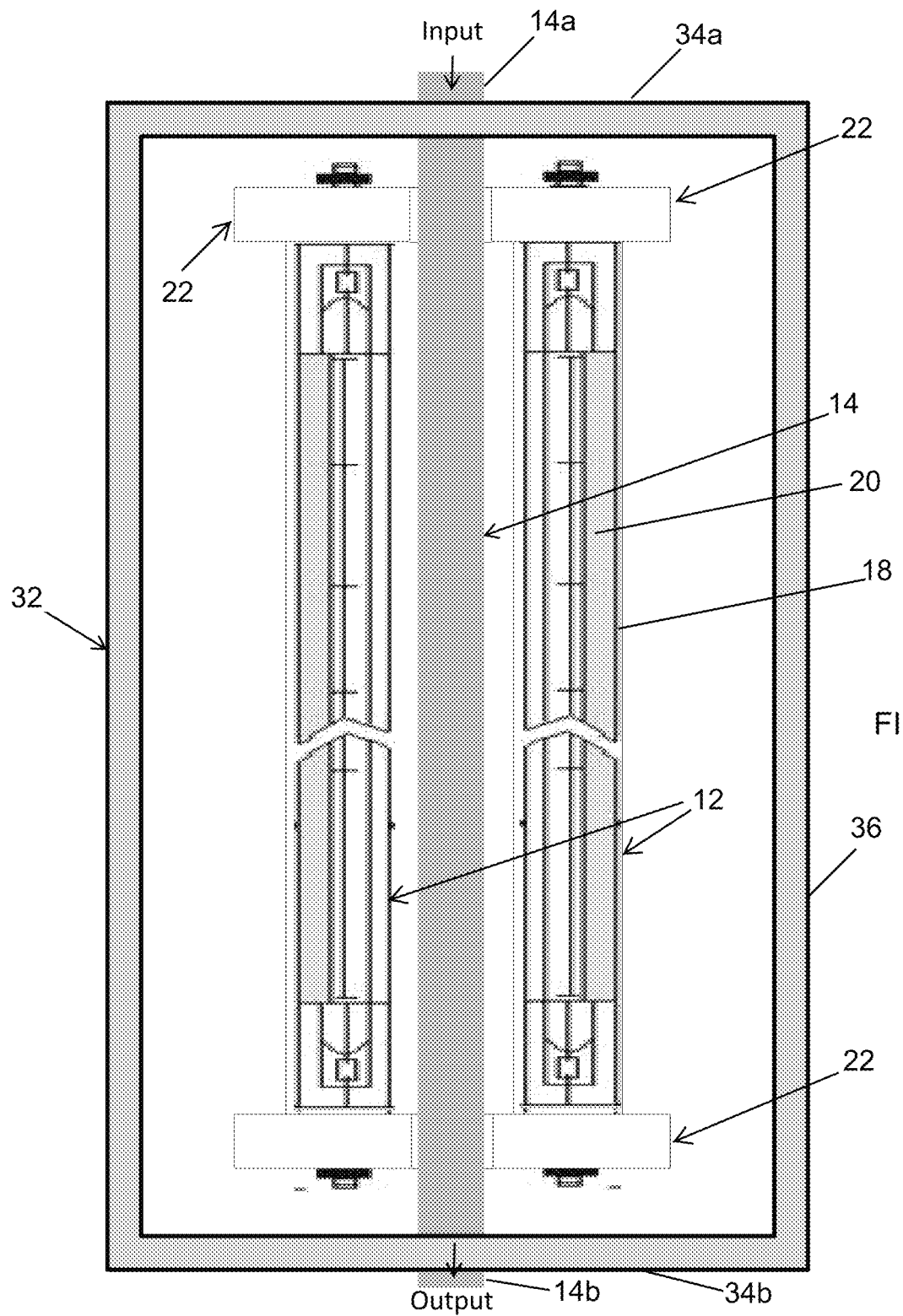
FIG. 5 is a schematic drawing of the steam generator and reactor with the lamp array system shown housed in enclosure.

To reduce heat loss and further prevent the risk of injury to a person in close proximity to the generator, steam generator and reactor 10B optionally includes an enclosure 32 (FIG. 5). Enclosure 32 includes opposed ends walls 34a and 34b and perimeter wall 36 that extends between the two end walls 34a, 34b to house and enclose lamps 18, process conduit 14, and end bases 22. End walls 34a, 34b include openings for the inlet end of process conduit 14 and for the outlet end of process conduit 14 so that the generator and reactor 10B, with the exception of the inlet and outlet ends, is fully contained within the enclosure. Optionally, the enclosure may be formed from thermally insulated material, such as various ceramics. Additionally, enclosure 30 may include internal insulation material, such as quartz wools or the like. Alternately, or in addition, enclosure 30 may include an outer water-cooled jacket formed in perimeter wall 36, or that extends around perimeter wall 36, to provide insulation or additional insulation.

In a test of a generator and reactor constructed in accordance with the first embodiment, namely with six 1000 W tungsten halogen lamps operated at 40% power and a water input flow of 120 $cm^3$ per minute, superheated steam was produced at nearly 500° C. in less than 15 seconds, which is equivalent approximately to 200 liters per minute of superheated steam. It should be understood that the lamps may be operated in a range of % of power, including about 25% to about 80% power depending on the desired temperature. Therefore, depending on the number of lamps, the power rating of the lamps, the flow of fluid into the process conduit, and the applied power, the temperature of the superheated steam may vary from 101 C to about 1150 C, and the speed at which the steam is generated may vary from about 5 seconds to 15 seconds.

As noted above depending on the chemicals in the exhaust line of semiconductor chamber 10A, control system 10D will vary the operation of lamps 18. For exhaust liquid from semiconductor chamber 10A containing TEOS, TiCl4, or TMA, control system 10D may be programmed to operate the 1000 W tungsten halogen lamps (optionally 2, optionally 4, or optionally 6) at 25% to 80% power with a water input flow of about 50-20 cm3 per minute to generate 101 C-1150 C steam in about 5-15 second, and optionally in less than 10 seconds.

Further, the process conduit 14 may be configured with more than one inlet. For example, as more fully described below in reference to FIG. 7, one inlet may form a first inlet that is in fluid communication with a supply of water to generate steam from the water flowing in from the first inlet, while the second inlet may be in line and fluid communication with the exhaust line of semiconductor chamber 10A. The second inlet may be in fluid communication with the process conduit 14 downstream of the first inlet, where the water (flowing in from the first inlet) has already been heated to steam and, optionally, to superheated steam so that the exhaust fluid is directed into the flow of the steam or superheated steam.

Referring to FIG. 1A, the numeral 10' generally designates another embodiment of the semiconductor processing system, where the steam generator and reactor 10B is not in line with the exhaust line and, instead, injects superheated steam in the exhaust line of the semiconductor chamber 10A downstream of the pump 10C. In this embodiment, the inlet of the steam generator and reactor 10B is in fluid communication with a supply of water, which is then converted to superheated steam with the lamps described above, and the outlet is in fluid communication with the exhaust line of the semiconductor chamber 10A where the superheated steam is injected into the exhaust line to effect both physical and chemical transformations of the chemicals used in and exhausted (output) from semiconductor chamber 10A.

Figure 6:
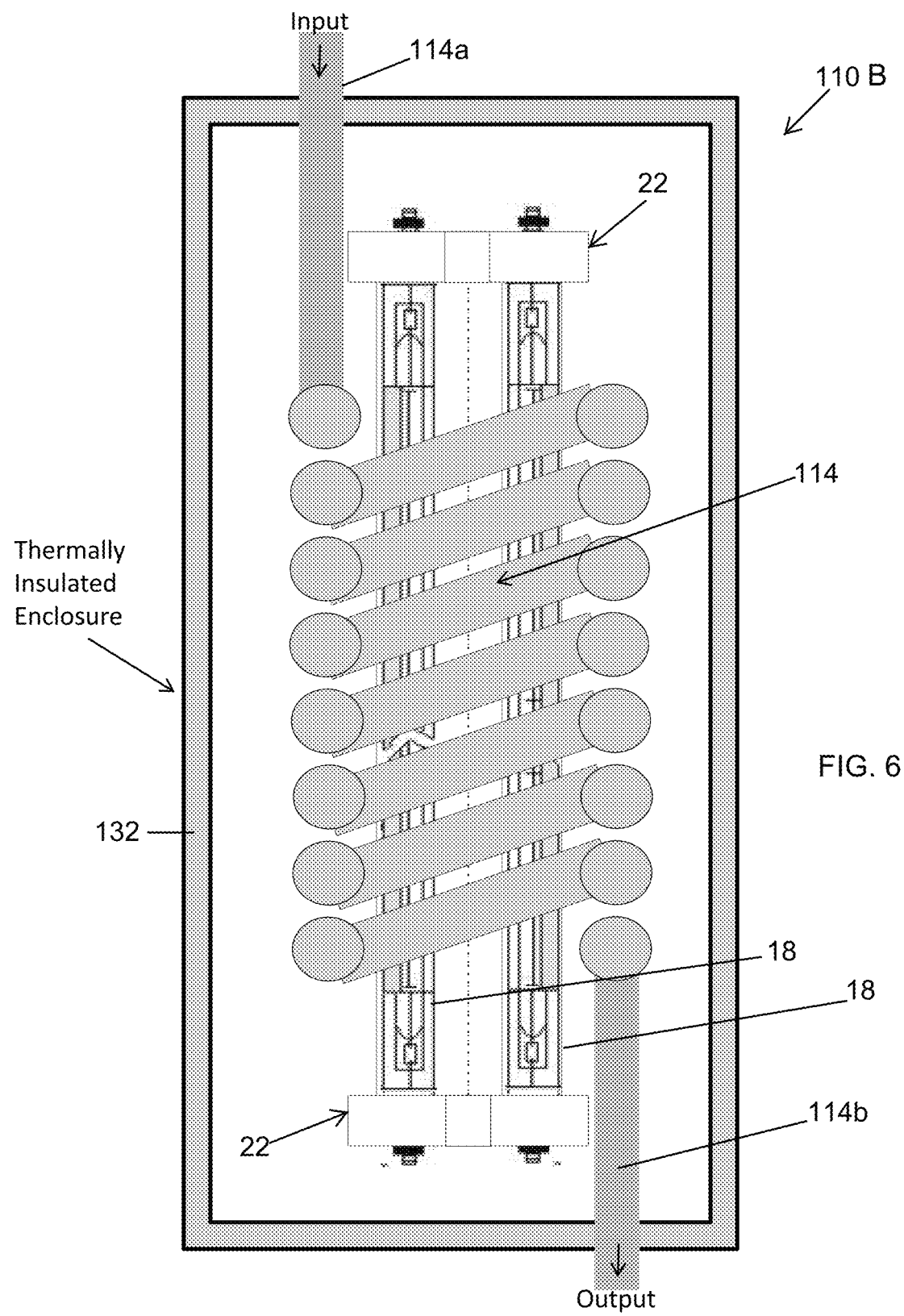
FIG. 6 is a schematic drawing of the lamp array system with another embodiment of a process conduit.

According to a second embodiment of a generator and reactor 110B, the process conduit may be configured to surround the lamps. Referring to FIG. 6, generator and reactor 110B includes a process conduit 114 is configured as a coil with a first linear portion that forms the input 114a and a second linear portion 14b that forms output 114b, which extend through the end walls of enclosure 130 similar to the previous embodiment. In this manner, process conduit 114 surrounds lamps 18. With this configuration, the surface area of the process conduit is greatly increased and, therefore, more heat emitted from the lamps may be absorbed by the fluid flowing through the process conduit. Further, with this configuration, the reflective coatings may be eliminated or their location may be varied. For example, the reflective coatings may be provided on the inwardly facing side of each respective lamp so that all the heat emitted by the lamps is directed outwardly through the outwardly facing sides of the lamps.

To maximize the heat absorbed by the process conduit, the coiled portion of the process conduit is sized such that it covers the majority, if not all, of the heated lengths of the respective lamps (see FIG. 1).

Figure 7:
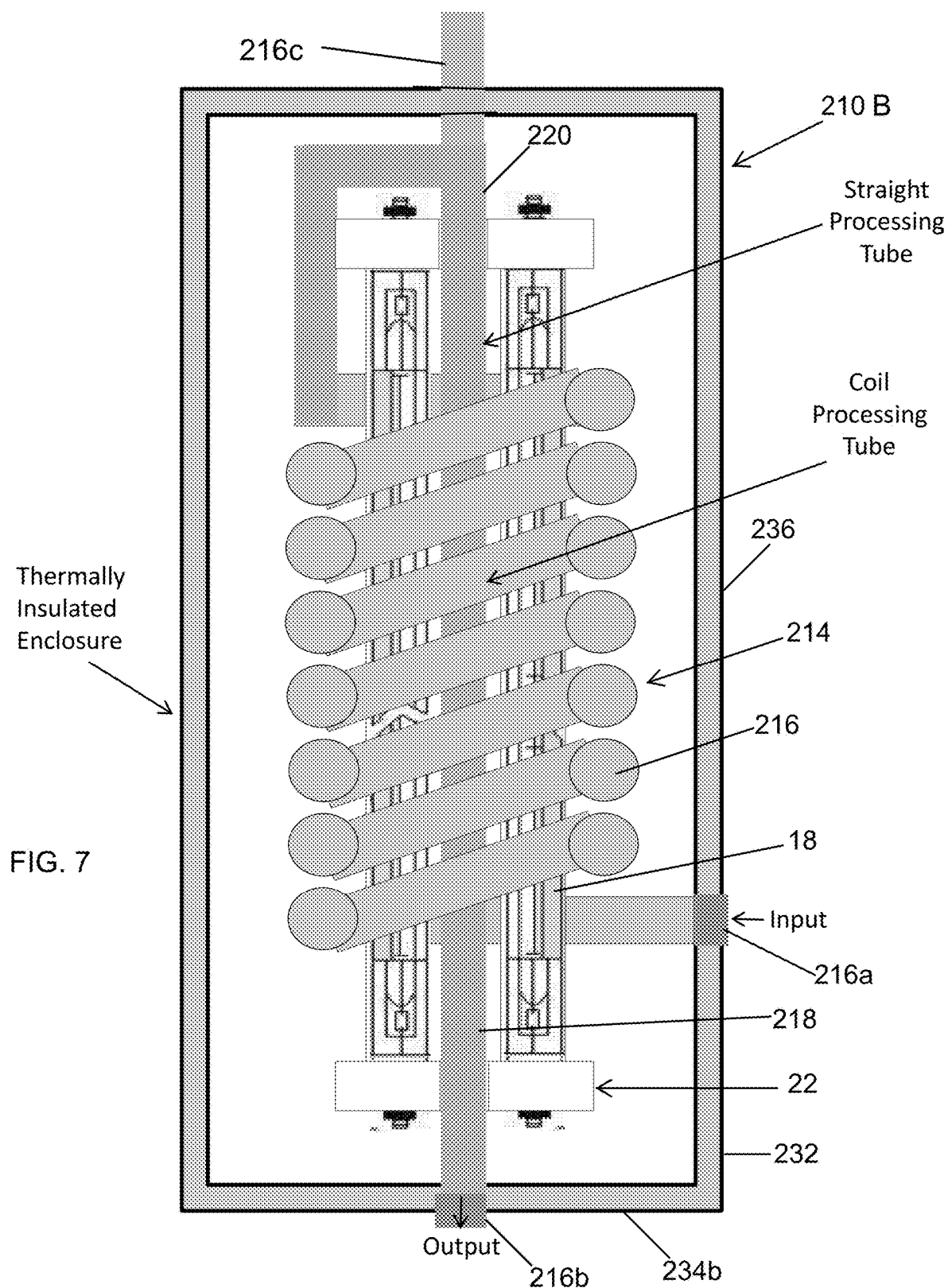
FIG. 7 is a schematic drawing of the lamp array system with a third embodiment of a process conduit.

According to yet another embodiment of the generator and reactor 210B, the process conduit 214 may be configured with two portions—a first portion that surrounds the lamps, and a second portion which is surrounded by the lamps. Referring to FIG. 7, process conduit 214 of generator and reactor 210B includes a first, coiled portion 216 that is coiled and surrounds the lamps 18, and a second straight portion 218 that extends between the lamps 18 and is surrounded by the lamps, similar to the first embodiment. The coiled portion of the process conduit is joined with the straight portion of the process conduit by a third portion 220, which has an inverted L-shaped configuration. As would be understood, the shape of the third portion may vary. In this manner, the coiled portion 216 is in series with the straight portion 218 of process conduit 214.

In the illustrated embodiment, the coiled portion 216 includes the inlet 216a for fluid communication with the exhaust line of the semiconductor chamber 10A or water supply through the perimeter wall 236 of enclosure 230, and the straight portion 218 of process conduit 214 extends downwardly through the end wall 234b of enclosure 232 to output the steam at outlet 216b.

As noted above, the process conduit 214 may be configured with more than one inlet. For example, inlet 216a, noted above, may form a first inlet, and another inlet 216c may be provided, for example, at the top of straight portion 218 (e.g. at the transition between the coiled portion 216 and straight portion 218), which forms a second inlet 216c. First inlet 216a may be in fluid communication with a supply of water, while second inlet 216c may be in line and in fluid communication with the exhaust line of semiconductor chamber 10A. In this manner, generator and reactor 210B can generate steam from the water flowing in from the first inlet, optionally superheated steam, while the second inlet 216c, which is fluid communication with the process conduit 14 downstream of the first inlet, introduces the exhaust fluid into the flow of the steam or superheated steam. Thereafter, the steam and exhaust fluid mixture is further heated as the water and exhaust fluid flow through the straight portion of the process conduit.

Generator and reactor 210B may also include an enclosure 232, for example, of similar construction to enclosure 32, which provides an insulated enclosure for the lamps 18 and for most of the process conduit, with the exception of the inlet and outlets. Therefore, reference is made to enclosure 32 for any additional details.

With this increase in surface area in the process conduit, generator and reactor 210B may produce a very high temperature superheated steam at a very high volumetric flow rate. In one test, a generator of the type described herein (with the six 1000 W tungsten halogen lamps) can generate 400 L per minute of superheated steam at 60% lamp power at temperature of nearly 500° C.

Figure 8:
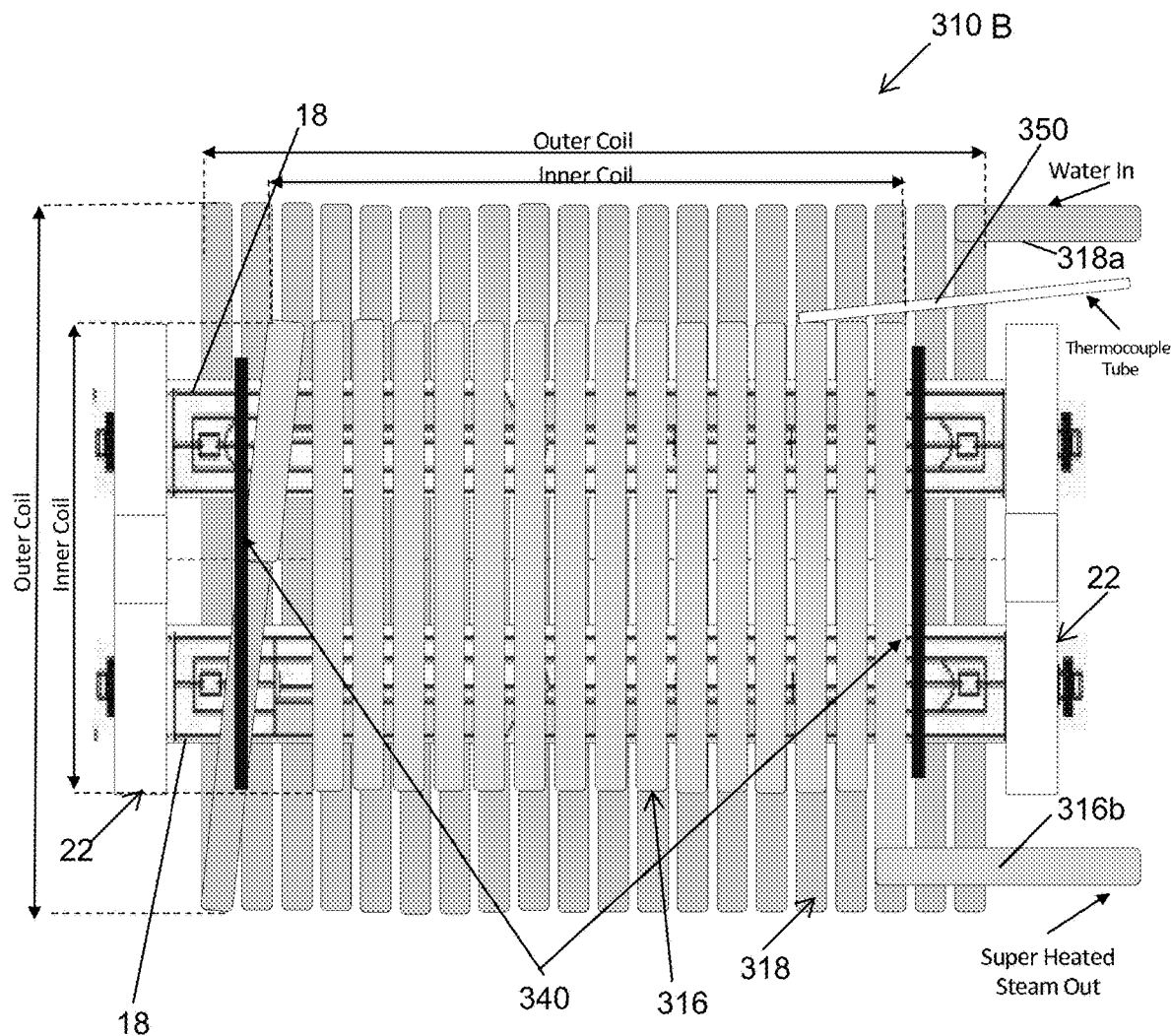
FIG. 8 is a schematic drawing of the lamp array system with a fourth embodiment of the process conduit.

In yet another embodiment of a generator and reactor, the process conduit may include a first portion that surrounds the lamps and a second portion that surrounds the first portion of the process conduit. Referring to FIG. 8, the numeral 310B generally designates another embodiment of a generator and reactor. Generator and reactor 310B includes a first coiled portion 316 that surrounds the lamps 18 and a second coiled portion 318 that surrounds the first coiled portion 316 of the process conduit 314. In the illustrated embodiment, first coiled portion 316 is sized to extend over the heated length of each of the respective lamps, similar to the second and third embodiment. Second coiled portion 318 is sized to extend over first coiled portion 316 and substantially the full length of the lamps 18. Consequently, the outer coiled portion is longer in coil length than the inner coiled portion. Additionally, the diameter of the second coiled portion may be greater than the diameter of the first coiled portion so that it completely surrounds the inner coiled portion as described and shown. Further, insulation may be added to the outer coiled portion prior to installing it within the enclosure (not shown, but reference is made to the enclosures of the previous embodiments for examples of insulation). In the illustrated embodiment, both the inlet and outlet ends of the process conduit extend through one of the end walls of the enclosure and, therefore, exit the enclosure from the same side.

By directing the fluid (water and/or exhaust fluid) about the inner coiled portion 316 by way of outer coiled portion 318, the outer coiled portion 318 of the process conduit 314 may act as an insulator to reduce heat from reaching the enclosure for safe handling during operation and, further, to increase the thermal efficiency of heat transfer from lamps to the process conduit.

While illustrated with a single input 318a and a single output 316a, the process conduit may include a second input (similar to the second input described above), which directs the exhaust fluid into the steam generated in the water flowing in from inlet 318a. For example, the second inlet may be located at the transition between the two coiled portions so that the exhaust fluid is again introduced downstream of the water and hence introduced into the steam.

Optionally, generator and reactor 310B may include one or more radiation shields 340. Shields 340 may comprise plates, such as circular plates, and be constructed of high temperature ceramic materials, including mica or other machineable ceramic material, including machineable glass ceramic similar to the material that may from the end bases. Shields 340 are located between the end of the lamps and the process conduit to shield the ends of the lamps from at least some of the radiation emitted by the lamps and heat emitted from the process conduit. These radiation shields, therefore, minimize the amount direct radiation heat loss that can reach the outer coil and the generator's enclosure. Accordingly, with the addition of the outer coil, the high temperature insulation between the coils, and the radiation shields the lamps' ends can be cooler than they would otherwise and, therefore, can extend the life of the lamps.

In any of the above generator and reactors, as described, the process conduit 14 may be in line or at least partially in line with the exhaust line of the semiconductor processing chamber 10A, or as noted may be incorporated into the system (such as system 10') to inject superheated steam into the exhaust line of the semiconductor processing chamber 10A.

In any of the above generator and reactors, a ventilation fan may be incorporated into the enclosures, which draws outside ambient air into the space inside the enclosure between the insulated process conduit and the enclosure to cool the end of the lamps, which may extend the life of the lamps.

In any of the above generator and reactors, as shown in reference to generator 310B, thermocouple tubes 350 may be added and coupled to the process conduit, such as the inner coiled portion in the illustrated embodiment, and to the computer based control system (e.g. the control system 16 referenced above, which may be used in this and any of the above generators). The thermocouple tubes 350 may allow for greater control over the operation of the respective lamps and steam production by providing feedback on the temperature of the process conduit to the control system, which as noted above may use the temperature of the process conduit to control the generator and reactor.

Accordingly, the generators described herein can produce superheated steam in a matter of seconds, for example in as little as 10 seconds, depending on the percent of lamp power employed and water or exhaust fluid input flow rate. The generator and reactors also can be turned off nearly instantaneously by turning off the inlet flow and the lamp power. It can be used in production cycles with variable cycle times or it can be used to produce continuous flow rate of superheated steam at constant temperature. This can be achieved readily by the use of the computer control system described above, that controls the percent power delivered to the lamps based on the water flow rate and desired superheated steam outlet temperature. These generator and reactors can produce superheated steam at one atmosphere and, therefore, do not require any of the costly certifications of the high pressure superheated generators. However, it should be understood that the generators may use back pressure at the outlet or downstream from the outlet to vary the pressure in the process conduit.

The invention claimed is:

1. A semiconductor processing system comprising:
a semiconductor processing chamber;
an exhaust line in fluid communication with the semiconductor processing chamber; and
a steam generator and reactor having a process conduit with an inlet and an outlet, said outlet in fluid communication with the exhaust line, said steam generator and reactor generating heat and directing the heat to the process conduit along a length of said process conduit between said inlet and said outlet of said process conduit and configured to heat the process conduit for generating superheated steam in the process conduit, and the process conduit generating superheated steam in the exhaust fluid flowing in the exhaust line to effect both physical and chemical transformations of chemicals in the exhaust fluid flowing in the exhaust line,
wherein the inlet comprises a second inlet, and the steam generator and reactor having a first inlet in fluid communication with the process conduit and a supply of water, the steam generator and reactor configured to generate the superheated steam from the water flowing into the process conduit from the first inlet, and the second inlet in fluid communication with said process conduit downstream of the first inlet wherein the exhaust fluid is injected into the superheated steam.

2. The system according to claim 1, wherein the steam generator and reactor is configured to generate superheated steam at least at 101 C.

3. The system according to claim 1, further comprising a pump in fluid communication with the exhaust line, wherein the pump includes a pump outlet, the steam generator and reactor generating the superheated steam in the exhaust line fluid at or near the pump outlet.

4. A semiconductor processing system comprising:
a semiconductor processing chamber;
an exhaust line in fluid communication with the semiconductor processing chamber; and
a steam generator and reactor having a process conduit with an inlet and configured for generating superheated steam in the process conduit, the exhaust line in fluid communication with the process conduit for generating superheated steam in the exhaust fluid flowing in the exhaust line to effect both physical and chemical transformations of chemicals in the exhaust fluid flowing in the exhaust line, wherein said steam generator and reactor is in line with the exhaust line such that the exhaust line fluid from the exhaust line flows into the process conduit at the inlet of the process conduit.

5. The system according to claim 4, wherein the steam generator and reactor is configured to generate superheated steam in a range of 101 C to about 1150 C.

6. The system according to claim 4, further comprising a pump, wherein the steam generator and reactor is in fluid communication with the exhaust line downstream of the pump.

7. The system according to claim 4, further comprising a pump, wherein the pump includes a pump outlet, the steam generator and reactor generating the superheated steam in the exhaust line fluid at or near the pump outlet.

8. The system of claim 4, wherein the steam generator and reactor comprises a plurality of tungsten halogen lamps spaced around at least a portion of the process conduit and extending along a length of the process conduit between said inlet and said outlet of the process conduit.

9. A method of converting a liquid and/or a gas in the exhaust fluid flowing in an exhaust line from a semiconductor chamber into one or more other compounds, the method comprising:
providing a semiconductor processing system according to claim 4, wherein the steam generator and reactor are configured to generate superheated steam in the process conduit to a temperature of at least 101 C;
flowing the exhaust fluid into the inlet of the steam generator and reactor; and
generating the superheated steam in the process conduit to thereby transform the liquid and/or gas in the exhaust fluid into a compound.

10. The method according to claim 9, wherein the generating the superheated steam includes generating superheated steam to a temperature in a range of 101 C to about 1150 C in about 5-15 seconds.

11. The method according to claim 9, wherein the generating the superheated steam includes generating superheated steam to a temperature of about 1000 C to about 1150 C in about 5-15 seconds.

12. The method according to claim 9, wherein the inlet comprises first and second inlets, further comprising flowing water into the first inlet and generating steam with the water, and the flowing the exhaust fluid includes flowing the exhaust fluid into the second inlet and directing the exhaust fluid through the second inlet into the process conduit downstream of the first inlet.

13. The method according to claim 12, wherein the generating steam with the water includes generating superheated steam with the water upstream of the second inlet wherein the flowing the exhaust fluid includes flowing the exhaust fluid into superheated steam.

14. The system according to claim 8, wherein said tungsten halogen lamps of said steam and reactor generating generate heat and direct the heat to the process conduit along a length of said process conduit between said inlet and said outlet of said process conduit to generate the superheated steam in the exhaust fluid flowing in the exhaust line.

15. A semiconductor processing system comprising:
a semiconductor processing chamber;
an exhaust line in fluid communication with the semiconductor processing chamber; and
a steam generator and reactor having a process conduit with an inlet and an outlet, said outlet in fluid communication with the exhaust line, said steam generator and reactor generating heat and directing the heat to the process conduit along a length of said process conduit between said inlet and said outlet of said process conduit and configured to heat the process conduit for generating superheated steam in the process conduit, and the process conduit generating superheated steam in the exhaust fluid flowing in the exhaust line to effect both physical and chemical transformations of chemicals in the exhaust fluid flowing in the exhaust line, and wherein the steam generator and reactor comprises a plurality of tungsten halogen lamps spaced around a first portion of the process conduit, the first portion having said inlet and said outlet, the plurality of tungsten halogen lamps extending along a length of the first portion of the process conduit between said inlet and said outlet, and the process conduit having a second portion, and the second portion surrounding the plurality of tungsten halogen lamps.

\* \* \* \* \*

UNITED STATES PATENT AND TRADEMARK OFFICE
CERTIFICATE OF CORRECTION

| | |
|---|---|
| PATENT NO. | : 11,705,345 B2 |
| APPLICATION NO. | : 16/862898 |
| DATED | : July 18, 2023 |
| INVENTOR(S) | : Imad Mahawili |

It is certified that error appears in the above-identified patent and that said Letters Patent is hereby corrected as shown below:

In the Specification
Column 5
Line 25, "which s very" should be --which is very--

In the Claims
Column 13
Lines 2-3, "steam and reactor generating generate heat" should be --steam generator and reactor generate heat--

Signed and Sealed this
Fifth Day of September, 2023

Katherine Kelly Vidal
*Director of the United States Patent and Trademark Office*